(12) United States Patent
Secareanu

(10) Patent No.: US 12,095,485 B2
(45) Date of Patent: Sep. 17, 2024

(54) BINARY DATA COMPRESSION / DECOMPRESSION METHOD

(71) Applicant: Radu Mircea Secareanu, Phoenix, AZ (US)

(72) Inventor: Radu Mircea Secareanu, Phoenix, AZ (US)

(73) Assignee: RADU MIRCEA SECAREANU, Phoenix, AZ (US)

( * ) Notice: Subject to any disclaimer, the term of this patent is extended or adjusted under 35 U.S.C. 154(b) by 164 days.

(21) Appl. No.: 17/974,057

(22) Filed: Oct. 26, 2022

(65) Prior Publication Data

US 2024/0146328 A1 May 2, 2024

(51) Int. Cl.
*H03M 7/30* (2006.01)
*H03M 7/46* (2006.01)

(52) U.S. Cl.
CPC ........... *H03M 7/3088* (2013.01); *H03M 7/46* (2013.01)

(58) Field of Classification Search
CPC ......... H03M 7/30; H03M 7/46; H03M 7/3088
See application file for complete search history.

(56) References Cited

U.S. PATENT DOCUMENTS

| | | | | | |
|---|---|---|---|---|---|
| 5,109,226 A * | 4/1992 | MacLean, Jr. | .......... | H03M 7/42 |
| | | | | | 341/95 |
| 5,136,291 A * | 8/1992 | Teague | ...................... | G06F 5/00 |
| | | | | | 341/83 |
| 5,324,923 A * | 6/1994 | Cymbalski | ............... | G06K 7/14 |
| | | | | | 235/494 |
| 5,475,388 A * | 12/1995 | Gormish | ............... | H03M 13/23 |
| | | | | | 341/58 |
| 5,488,364 A * | 1/1996 | Cole | ....................... | G06T 9/005 |
| | | | | | 341/63 |
| 5,710,562 A * | 1/1998 | Gormish | ................. | G06T 9/005 |
| | | | | | 341/51 |
| 6,437,715 B1 * | 8/2002 | Cowlishaw | ............. | H03M 7/12 |
| | | | | | 341/59 |

(Continued)

*Primary Examiner* — Lam T Mai

(57) ABSTRACT

A binary data compression/decompression method is disclosed, where any input binary data string (IFDS) is uniquely and reversibly compressed/decompressed without any data loss by first uniquely formatting and fully describing the IFDS using a set of well defined binary constructs, followed by creating complex structures from custom combinations of said binary constructs that occur within the arbitrary IFDS content, wherein the choice of the said custom combinations depend on the said IFDS content in term of binary constructs therefore creating IFDS content variations and distributions from an expected nominal base wherein said variations and distributions reflect the actual content of the arbitrary IFDS, followed by uniquely processing these variations and distributions in content using several schemes where each scheme brings a unique compression feature, and wherein once this processing completes (i.e. the end of the arbitrary IFDS is reached), it is called that the end of one compression cycle is reached, and wherein another compression cycle can be applied to the data by repeating the cycle steps, and where such compression cycles are repeated until the desired compressed file is reached or until a file floor size limit is reached, floor size below which the disclosed compression has limitations.

20 Claims, 6 Drawing Sheets

| RI type | 4 | 5 | 6 | 7 | 8 | 9 | 10 | 11 | 12 | 13 |
|---|---|---|---|---|---|---|---|---|---|---|
| NO_1 | 4 | 9 | 11 | 12 | 11 | 9 | 9 | 11 | 7 | 7 |
| NO_2 | 5 | 10 | 12 | 13 | 12 | 10 | 10 | 12 | 8 | 8 |

| | 14 | 15 | 16 | 17 | 18 | 19 | 20 | 21 | >22 |
|---|---|---|---|---|---|---|---|---|---|
| | 7 | 8 | 8 | 5 | 4 | 2 | 3 | 2 | 0 |
| | 8 | 9 | 9 | 6 | 5 | 3 | 4 | 3 | 1 |

(56) References Cited

U.S. PATENT DOCUMENTS

| | | | | |
|---|---|---|---|---|
| 7,215,265 B2* | 5/2007 | Guionnet | | H03M 7/30 |
| | | | | 341/67 |
| 7,348,904 B2* | 3/2008 | Christoffersson | | H03M 7/30 |
| | | | | 341/60 |
| 7,609,000 B1* | 10/2009 | Sharma | | H03M 7/40 |
| | | | | 341/59 |
| 8,098,247 B2* | 1/2012 | Crucs | | H03M 7/42 |
| | | | | 382/241 |
| 8,941,513 B1* | 1/2015 | Dupont | | H03M 7/6088 |
| | | | | 341/51 |
| 9,743,117 B2* | 8/2017 | Gervais | | H03M 7/4006 |
| 11,677,416 B2* | 6/2023 | Secareanu | | H03M 7/6005 |
| | | | | 341/50 |
| 2003/0223646 A1* | 12/2003 | O'Neill | | H03M 7/40 |
| | | | | 382/246 |
| 2006/0238390 A1* | 10/2006 | Yi | | H04N 19/94 |
| | | | | 341/87 |
| 2010/0039300 A1* | 2/2010 | Dey | | H03M 7/3088 |
| | | | | 341/51 |
| 2010/0219991 A1* | 9/2010 | Tang | | H03M 7/30 |
| | | | | 341/55 |
| 2011/0128167 A1* | 6/2011 | Schneider | | H03M 7/3086 |
| | | | | 341/51 |
| 2013/0063288 A1* | 3/2013 | Bley | | H04L 69/04 |
| | | | | 341/87 |
| 2014/0070966 A1* | 3/2014 | Fablet | | H03M 7/3086 |
| | | | | 341/55 |
| 2015/0130645 A1* | 5/2015 | Dupont | | H03M 7/6029 |
| | | | | 341/60 |
| 2015/0303940 A1* | 10/2015 | Dupont | | H03M 7/30 |
| | | | | 341/51 |
| 2016/0191075 A1* | 6/2016 | Branscome | | H03M 7/4037 |
| | | | | 341/67 |
| 2016/0204796 A1* | 7/2016 | Burukhin | | H03M 7/3077 |
| | | | | 341/51 |
| 2022/0368345 A1* | 11/2022 | Secareanu | | H03M 7/40 |
| 2023/0188162 A1* | 6/2023 | Ramadhane | | G06N 20/00 |
| | | | | 341/50 |
| 2023/0224141 A1* | 7/2023 | Secareanu | | H04L 9/0631 |
| | | | | 713/150 |
| 2023/0253982 A1* | 8/2023 | Secareanu | | H04L 9/0662 |
| | | | | 341/51 |

* cited by examiner

BINARY DATA COMPRESSION / DECOMPRESSION METHOD

FIELD

The present disclosure relates to binary data compression/decompression methods, and in particular to binary data compression/decompression methods that are suitable to be implemented in silicon, as a circuit, in addition (or not only) to be implementable in software.

BACKGROUND

Certain aspects disclosed in the utility patent applications (UPA) mentioned below are being used in the present disclosure. These UPA are filed by the same unique inventor as the present disclosure. These UPA are mentioned here as background for this disclosure. The present disclosure represents new matter. These background utility patent applications (UPA) are:

Application Number: 17398728
Applicant Name: Radu Mircea Secareanu
Filing date: 10 Aug. 2021
Application Number: 17573438
Applicant Name: Radu Mircea Secareanu
Filing date: 11 Jan. 2022
Application Number: 17667650
Applicant Name: Radu Mircea Secareanu
Filing date: 9 Feb. 2022

SUMMARY

At the onset, a note regarding the structure of this disclosure is required, note that will enable better understanding of the flow of the disclosure. Key concepts are defined, detailed, and exemplified, concepts that the disclosed embodiments from the present disclosure are based on. The binary data compression/decompression method, or the BDCD method, is progressively introduced during this process.

In summary, the BDCD method works as follows: an Initial Full Data String (IFDS) is serially formatted into a number of sequential Processing Strings (PS), where the length of each PS is determined by two conditions: 1) the occurrence of a fixed bit pattern, called Delimiter (DE) or 2) by the reach of a set maximum limit number of bits and/or a group of bits of well defined content with a number of bits less than the said maximum limit number of bits. Every PS consists of two parts: a root identifier (RI) part, followed by a detail (DL) part. A well defined set of RI is formed, and with this set, any arbitrary IFDS can be described. This description of any arbitrary IFDS using this well defined set of RI is called internal formatting (INFORM) of the IFDS. All these details are described and related claims are formulated in the above mentioned UPA. The BDCD method is processing the arbitrary RI content of an arbitrary IFDS to obtain data compression. The BDCD method is achieving this data compression by creating complex structures from combining RI, therefore creating IFDS content variations and distributions from the nominal IFDS content, variations and distributions that reflect the actual content of the arbitrary IFDS. The BDCD method is processing these complex structures using several schemes, as detailed in this disclosure. Once this processing completes (i.e. the end of the arbitrary IFDS is reached), it is called that the end of one compression cycle is reached. Another compression cycle can be applied to the data by repeating the process, using as new IFDS the output of the just completed compression cycle. Every new BDCD method cycle consists of the INFORM step of the previously completed compression output, followed by the above mentioned compression processing. Theoretically, an unlimited number of cycles can be employed. Practically, there is a file floor size limit (i.e. a file that is smaller than the file floor size may not provide compression gain). The file floor size limit depends on the BDCD method implementation options, and will be exemplified in the disclosure.

The decompression is perfectly mirrored to the compression process, leading to an identical, lossless restored file to the initial IFDS, which was the input to the first cycle.

The preferred implementation of the BDCD method is a hardware implementation. A software implementation will replicate identically all the functionality of the BDCD method, therefore the hardware and the software implementations are perfectly equivalent from the functionality point of view. A hardware implementation is more expensive than a software implementation, but it is faster in term of compression/decompression speed. Therefore, there is a trade-off between cost and speed between a hardware and software implementation. Because a hardware implementation is faster than a software implementation, certain applications are preferable to be implemented, and possibly only enabled, in a hardware implementation. On the other hand, because a software implementation has a much lower cost than a hardware implementation, certain applications are preferably implemented in a software implementation enabling a low cost for the user.

Concerning the hardware implementation aspects, as will be apparent from the details presented in this disclosure to a person familiar with digital design, the preferred hardware implementation of the BDCD method is, due to the serial nature of the BDCD method, a fully-pipelined based architecture. Such an architecture will provide the highest compression/decompression speed possible in a hardware implementation.

BRIEF DESCRIPTION OF DRAWINGS

Embodiments will be described, by way of example, with reference to the drawings, in which.

DETAILED DESCRIPTION OF THE INVENTION

At the outset it should be noted that the examples presented in the disclosure are in no way limiting, and the skilled person will appreciate that the disclosure is equally applicable to multiple variations and alternatives, and multiple optimizations are possible to increase the performance, such as the compression efficiency and speed.

As disclosed in the above mentioned UPA, in particular in Ser. No. 17/667,650, any arbitrary IFDS can be described using a well defined set of PS, respectively a well defined set of RI. This set of RI is summarised in FIG. 1, where:

Rows 101 and 104 detail existing RI classes. The RI classes are greater than 3, where the number represents the number of bits in the RI.

Rows 102 and 105 detail the number of distinct RI in each class, called RI class members, excluding RI corresponding to PS of same type bits.

Rows 103 and 106 detail the number of distinct RI in each class, called RI class members, including RI corresponding to PS of same type bits.

Figure 1:
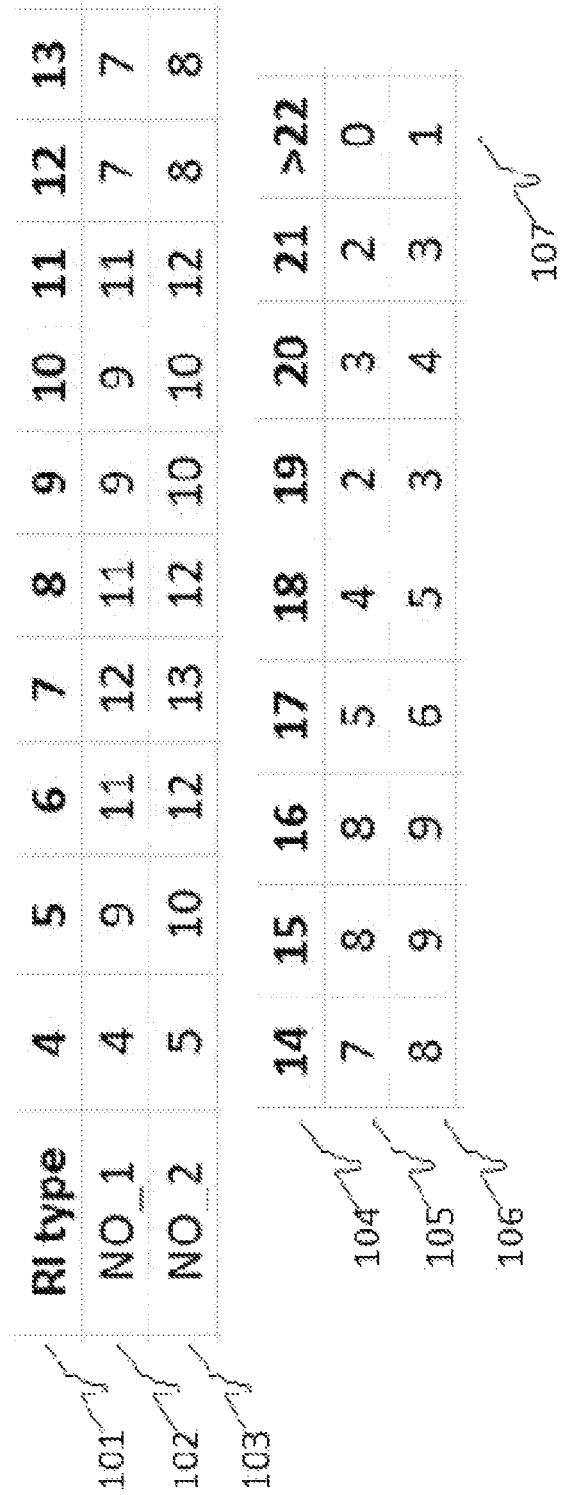
FIG. 1 is used to summarise the set of Root Identifiers (RI), set that is used to describe any arbitrary binary input string, set that is used in one or more of the embodiments.

Column 107, labelled ">22" (greater than 22), is placed in FIG. 1 for convenience, detailing in reality all PS of same type bits greater than 22. In reality, there is one entry/column for every PS of same type bits such as 22, 23, 24 . . . , theoretically to infinity, where each entry has one member. There are no RI greater than 22 other than RI describing same type bits PS.

Each RI class member has a very well defined nominal probability of occurrence in an IFDS. A member of class 4 RI has a nominal probability of occurrence of 6.25%, and this probability halves with every class increase. A 6.25% probability means for example that one in 16 PS (RI) that occurs in an arbitrary IFDS, is of that member type. This is a nominal occurrence rate, wherein in reality, there is a variability and distribution of occurrences for every member of, every RI class. The goal of the BDCD method is to exploit this variability and distribution in order to create compression for any arbitrary IFDS. To achieve this goal, constructs of RI content of an IFDS are created and processed using various schemes. These constructs can cover RI grouping, such as pairs, triplets, quadruplets, etc. of RI. In this disclosure, exemplification will be given using pairs of RI. For higher order grouping, the compression behaviour improves, with the disadvantage that a higher order grouping will require a larger IFDS slice, therefore a larger file floor size, as introduced above. Many other constructs of the RI content of an IFDS, other than grouping, are possible—such other constructs are not detailed in this disclosure because the concepts and outcome are similar.

Since, as shown in FIG. 1, an RI can have minimum 4 bits and maximum infinity, a pair of RI can therefore have minimum 8 bits and maximum infinity. A specific RI pair of X number of bits will be called in this disclosure a member of RI pair class X. For example, since there are 5 members of class 4 RI, there will be 25 members of RI pair class 8. Since there are 5 members of class 4 RI and 10 members of class 5 RI, there will be 100 members of RI pair class 9, representing all combinations of (a class 4 RI member) followed by (a class 5 RI member), or (a class 5 RI member) followed by (a class 4 RI member), in short, 4-5 or 5-4. Similarly, RI pair class 10 will have 220 members, representing all possible combinations 4-6, 5-5, 6-4. The maximum number of members in an RI pair class is for RI pair class 22, with 1276 members.

The concepts of "contained class", "origin class", and "target class" are introduced. A contained class is where all compression process occurs within that class only. An origin class and a target class create a pair of classes to complete the compression process. The compression within a contained class is different than the compression within a pair of origin class and a target class, both these compression processes being described below.

The concept of "pairing range" is introduced. A pairing range represents a set of PS within a processing string in which a pair of two RI can be created. Conventionally, a pair of two RI is created between two consecutive RI (PS). A pairing range can be for example a set of 32 RI (PS), where a pair of RI can be created between any two members of the set. There are 2*C32_2 (twice times combinations of 32 taken 2) pairs that can be considered in this set of 32 RI, i.e. 992 pairs. Note that in this 992 pairs there are direct and reverse pairs—for example, in the 32 RI set, the pair created between RI number 9 and RI number 15 (pair 9-15) is a direct pair, while the pair created between RI number 15 and RI number 9 (pair 15-9) is a reverse pair. If RI number 9 is of class 4 and RI number 15 is of class 5, pair 9-15 will create a class 9 RI pair of configuration 4-5, while pair 15-9 will create a class 9 RI pair of configuration 5-4, where the two configurations are dependent of each other, being made of same class 4 and class 5 RI members, and having the same number of occurrences in a string and RI pairing range. Therefore, direct and reverse pairs are dependent on each other. In a pairing range therefore, there are a number of independent pairs and double that number of dependent pairs (in the 32 RI pairing range example, there are 496 independent pairs and 992 dependent pairs).

The size of a pairing range is a function of what RI pair class is used. The RI pair class, in turn, is chosen as a function of desired variability and distribution (the larger the RI pair class, the larger the variability and distribution, and therefore more beneficial for compression. For example, if RI pair class 9 is chosen, the size of pairing range is 32, and the variability and distribution is created over a matrix of 496 independent pairs by 100 members. If RI pair class 10 is chosen, the size of the pairing range is 64, and the variability and distribution is created over a matrix of 2016 independent pairs by 220 members. The size of the pairing range is chosen as the minimal size to contain one nominal occurrence member of the lowest probability of the respective RI pair class.

BDCD_s1: BDCD Scheme 1

Figure 2:
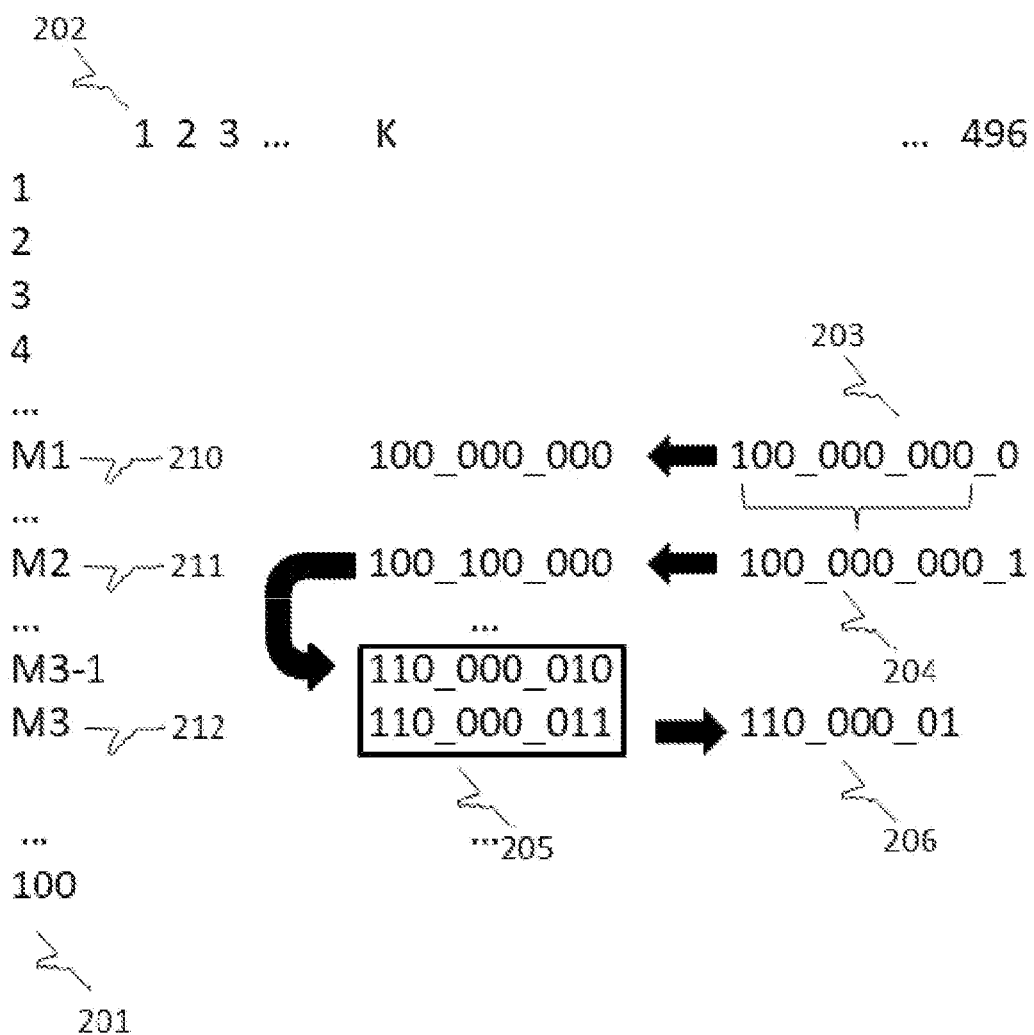
FIG. 2 is used to summarise the key embodiments and steps of the disclosed Scheme 1.

Scheme 1 refers to a BDCD implementation using a contained class. In the exposition for Scheme 1, reference will be made to FIG. 2. RI pair class 9 is used as the contained class, to exemplify. As outlined, the pairing range for class 9 is 32, and there are 496 distinct independent pairs that can be created. For each of the 100 members in the class, in one pairing range, nominally, there is 1 independent pair that occurs. For an ideal distribution, in approximately 512 pairing ranges (i.e. 512*32 PS, or about 16,000 PS), all 496 distinct independent pairs occur once for that member. An IFDS portion, or slice, is considered, where the size of this slice is a multiple of 16,000 PS, so that for each member, each of the 496 independent pairs is nominally represented by the same integer number of occurrences.

In an arbitrary IFDS, there is a distribution of occurrences for each of the 496 independent pairs per member, where a distribution matrix of occurrences of size 496 (the columns 202 in FIG. 2) by 100 (the rows 201 in FIG. 2) is created, distribution matrix that reflects the content of the arbitrary IFDS slice. Out of this matrix, of 49,600 entries, where each entry represents a member-pair construct, two entries, E1 (210 in FIG. 2) and E2 (211 in FIG. 2), that have the least occurrences (N1 respectively N2), and one entry E3 (212 in FIG. 2) that has the maximum occurrences (N3), are located. E1, E2, and E3 must belong to the same pair (same matrix column K in FIG. 2).

Say, within that pair (matrix column), E1 corresponds to member M1 and has the regular representation as 100_000_000 (9 bit representation), then this representation becomes 100_000_000_0 (10 bit representation 203 in FIG.

2). E2, corresponding to member M2 will be represented by 100_000_000_1 (204 in FIG. 2). The original representation of M2 (say this was 100_100_000) becomes available (not used). E3, corresponding to member M3, has representation 110_000_011. The member with the representation where the last bit from the M3 representation is flipped (i.e. 110_000_010, member (M3-1) in FIG. 2) will be represented by the original M2 representation, this transfer achieving the availability of 100_100_000 to 110_000_010. Once 110_000_010 becomes available, M3 can be represented using 8 bits (i.e. 110_000_01, 206 in FIG. 2), by combining the two representations in block 205 of FIG. 2. Therefore, each occurrence of members M1 and M2, with least occurrences, will be represented using 10 bits (at a loss of 1 bit per occurrence), while each occurrence of the said member with maximum occurrences (M3) will be represented using 8 bits (at a gain of 1 bit per occurrence). A net gain is obtained if N3>N1+N2.

Note that in the above exposition of the BDCD_s1, every pair is using an alternate representation of same number of bits as the original pair, alternate representation that can be created straightforward. The condition for this alternate representation is that all members within an RI pair class have the last bits as a consecutive counter. For example, RI pair class 9, class that has 100 members, will need a 7 bit counter, and the representation will be <two fixed bits>_<7 bit counter>. Obviously 28 positions of the 7 bit counter will become available and transferred into the 10 bit representation of RI pair class 10. This alternate representation of pairs is needed only for the matrix pair (column) that carry the E1, E2, E3 (M1, M2, M3).

BDCD_s1 does not require such alternate representation of RI pairs for implementation, but such alternate representation is recommended because the implementation is easier and more clear/focused. BDCD_s1 is disclosed when the implementation employs this alternate representation. BDCD_s2 implementation also recommends to have such an alternate representation of the RI pairs, however, for clarity in term of disclosing how to implement such a scheme without employing such an alternate representation, BDCD_s2 is disclosed without employing such an alternate representation. Both schemes can be implemented either way (with or without alternate representation), and since both implementations are disclosed, one per scheme, the disclosure is complete. The implementations are therefore not repeated in this disclosure both for each scheme.

Continuing with the BDCD_s1 disclosure, note that BDCD_s1 will require one pair (matrix column) out of 496 independent pairs to implement the scheme. Say this pair occurs between PS number 4 and PS number 27 in the 32 PS pairing range (i.e. matrix column 4_27) of every 32 PS pairing range. From the point of view of this 4_27 pair, the other 30 members of the 32 pairing range are irrelevant, they may remain unpaired, or may be paired in a certain way in order to achieve further compression for another of those pairs. A maximum of 16 pairs can be created and achieve compression for a 32 pairing range, so, a maximum of 16 out of the 496 matrix columns will be active for an IFDS slice. Within one of these 16 columns, there may be more than one E1-E2-E3 triplets that meet the condition for compression (i.e. N3>N1+N2).

To the condition for compression that the E1-E2-E3 triplets must meet, the cost must be added, where the cost represents the number of bits to specify the pair (matrix column, 9 bits required for class 9 that has 496 independent pairs) and the three M1-M2-M3 members (7 bits required for class 9 that has 100 members). Therefore, the cost for class 9 is 30 bits. The condition for compression becomes N3>N1+N2+30, or, generally, N3>N1+N2+cost.

EXAMPLES a. For an IFDS slice of 32*16,000 with a nominal N of 32, N1=18, N2=15, minimum N3=18+15+30. So, N1=18, N2=15, N3=63, N_nom=32
b. For an IFDS slice of 128*16,000 with a nominal N of 128, N1=70, N2=80, minimum N3=70+80+30. So, N1=70, N2=80, N3=180, N_nom=128
c. If there are two triplets on the same matrix column (pair) the pair (column) cost (9 bits) is shared between the two triplets, leading to a total cost per triplet of 25.5 (26) (instead of 30).
d. If the same triplet is used for all 16 pairs chosen in a suite of a pairing range used in an IFDS slice, then the cost per pair per triplet becomes 9+21/16, or 11 (instead of 30).
e. For an IFDS slice of 8*16,000 with a nominal N of 8, it is a high probability that within the 496*100 member distribution in the matrix, there are entries with zero occurrences. In this case, only the entry with zero occurrences suffice (instead of two members with minimal occurrence), i.e. E1 suffice instead of E1 and E2. The cost is also reduced from 30 to 23 (i.e. 9+2*7). In this case, N1=0, resulting in a minimum N3=0+23. So, N1=0, N3=23, N_nom=8.
f. Note at (e) above that the largest slice having an entry with zero occurrences is desired. For example, if the slice is 16*16,000, N1=0, N3=23, N_nom=16, distribution that relaxes the requirements for N3.
g. If the two E1 and E2 entries (with N1 and N2 occurrences) have the same RI members (such as 4-5 and 5-4, with the same class 4 and class 5 RI), then the cost is reduced from 30 to 23 (9 bit for the matrix column plus 7 bit for the 4-5 member plus 7 bit for E3 member). A 1 bit identifier for this option may be added to the cost, for a total cost of 24. This option is particularly useful for low N_nom slices (such as N1=16, N2=17, N3=57, for N_nom=32).
h. If multiple IFDS slices have similar entries, then the cost is divided to the number of slices. For example, for a cost of 30 and three slices that have same E1, E2, E3, the cost per slice becomes 10. An identifier plus a counter specifying the number of slices may be added to the cost, addition that is also divided to the number of slices, leading to the cost per slice increase of one bit (11 instead of 10).
i. If at (e) above, the E3 entry (with N3 occurrences) has the same RI members as the E1 entry (with zero occurrences) as described at (g) above, the cost is further reduced to 9 (for the matrix column) plus 7 (for the E1 entry) plus an identifier (1 bit) to specify this option. This option is particularly useful for low N_nom (for example, N1=0, N3=17 (cost, 9+7+1), N_nom=8).

Multiple variations are possible, Multiple such triplets and duplets can exist in an IFDS slice distribution within one matrix column and within the 16 pairings within the pairing range, to maximize the compression. In addition, multiple RI pair classes can be considered at the same time, such as class 9, class 10, and class 11. The larger the class, the wider the distribution of entries (for example, for class 10, the matrix size is 2016*220), therefore the larger the probability to find triplets that meet the compression condition or to find entries with zero occurrences. Note also that focusing the compression on implementing entries with zero occurrences will insure IFDS slices smaller in size, which is extremely beneficial for certain applications such as live HI-Fi audio broadcasting, including telephony.

BDCD_s2: BDCD Scheme 2

Scheme 2 refers to a BDCD implementation using an origin class and a target class. Scheme 2 does not work in a contained class. Scheme 2 is disclosed in an implementation that does not employ the alternate representation of pairs. As mentioned, this is done for full disclosure, in order to exemplify how to implement such a scheme both ways (with or without employing alternate representation of pairs). As mentioned, both Scheme 1 and Scheme 2 can be implemented either way. Also as mentioned, while Scheme 2 is disclosed in an implementation that does not employ an alternate representation of pairs, employing such a representation is recommended because it is easier and has more clarity. However, qualifications such as "easier" and "more clarity", are subjective; there is a complete freedom to implement one way or another.

Figure 3:
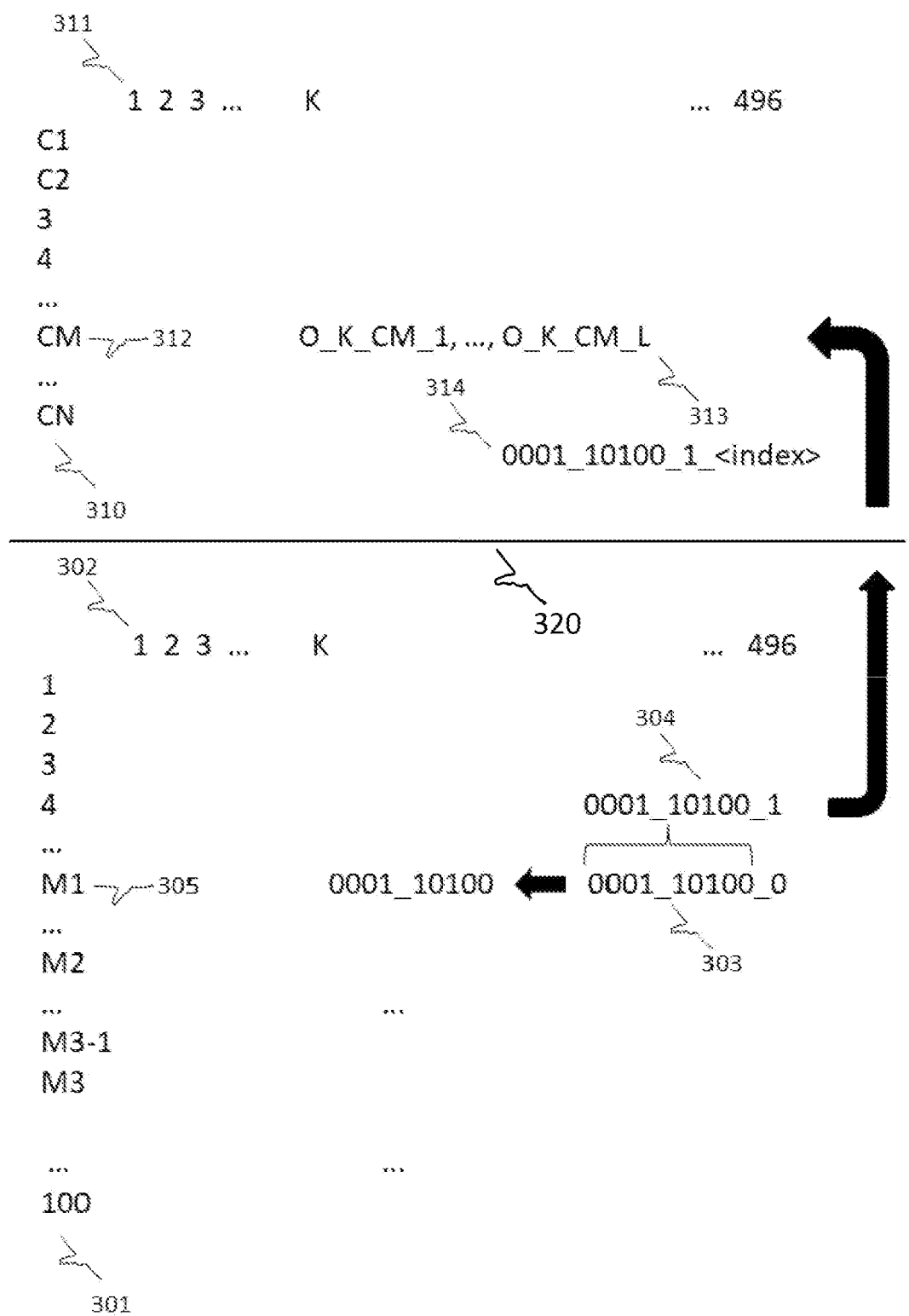
FIG. 3 is used to summarise the key embodiments and steps of the disclosed Scheme 2.

Discussions and examples for Scheme 2 will be disclosed having primarily RI class 9 as origin class. Using upper classes as the origin class, will lead, similarly as Scheme 1, to wider variations and distributions, which are beneficial for compression for similar reasons as discussed at Scheme 1. Scheme 2 has commonality with Scheme 1—only the differences will be outlined below. FIG. 3 is used to facilitate this part of the disclosure. In FIG. 3, the specifics for this part of the disclosure that are relevant to the origin class are detailed below line 320, while the specifics for the target class are detailed above line 320.

For the origin class, below line 320 in FIG. 3, in the 496 (columns 302 in FIG. 3) by 100 (rows 301 in FIG. 3) matrix, function of slice size, an entry E1 (305 in FIG. 3) with zero or minimal occurrences is located. Be this entry located at the intersection of pair (column) k and member M1 (row M1) in the matrix. For better understanding, say that the entry E1 represents, in the pairing range of every successive group of 32 PS in the current IFDS slice, the pair between PS 4 and PS 27 (i.e. matrix column 4_27, which is referred to as column k). Member M1 (row M1) consists of RI of four bits 0001 (for PS 4) and RI of five bits 10100 (for PS 27), i.e. it is a 4_5 RI pair class 9 member. In Scheme 1 implementation, this member was receiving an alternate 9 bit representation. In Scheme 2 implementation, the two components of the member remain unchanged on their position, with the only adjustment that if the member has non-zero occurrences, the second RI in the pair (here the five bit RI) receives a "_0" extension (i.e. it becomes 10100_0). If the member has zero occurrences, the two RIs remain as is without any adjustments. In this example, the 0001_10100 construct of the two RIs for that pair does not show up, so the nine bit construct becomes available for use in the target class.

As mentioned, for non-zero occurrences, if the two RI of member M1 would be put together, they would form the unique ten bit construct 0001_10100_0 (303 in FIG. 3). Given that this unique construct is identified in the matrix, at the pair (column) member (row) intersection, the 0001_10100_1 (304 in FIG. 3) becomes also in existence as a unique construct. In this scheme, this unique construct will be used to describe members of a target (upper class), rather than being used in conjunction with another member E2 to create gain using E3 (as in Scheme 1). So, in Scheme 2, E1 and a target class is needed, rather than a triplet as in Scheme-1.

Concerning the target class (above line 320 in FIG. 3), consider for example class 19 as the target class. Before detailing the said class 19 target class for this example, the big picture is introduced. A so called target matrix from where a target class can be chosen, is formed. This target matrix is of size 496 (same size as the matrix for the origin class, columns 311 in FIG. 3) by CN (rows 310 in FIG. 3). The columns in the target matrix have exactly the same significance as in the origin matrix, i.e. they represent the pairs created within the pairing range; clearly, these pairs apply for all classes. Each row in the target matrix represents a class, where such class is of larger number of bits that the origin class. For example, if the origin class, for which the origin matrix is built, is for class 9, the possible target classes (rows) in the target class matrix is 10 and above. For practical reasons, it makes sense to use a tighter range of classes that can be candidates, such as between 4 and 19 classes above the target class (in the class 9 example, this translates that the target matrix rows are in-between class 13 and class 28). For each row in the target matrix, such as the class 19 row, the number of occurrences for each of the 496 pairs for that class, are summed and entered in the matrix at that position. This sum of occurrences is entered in tem of several divisions, where each division represents a sum of well defined members within that class, as detailed next using an example. In FIG. 3, these divisions are suggested by 313, i.e. O_K_CM_1 to O_K_CM_L, where O_K_CM_I means the sum for members of division I for class CM at pair K.

Class 19 has 1138 members (of 19 bits). While these class 19 members (target class members) are summed and entered as a sum in the target matrix (on a few divisions basis), they must not loose their individuality, so that at decompression they are fully restored. That is why, in the compressed output data stream, they are entered as a combination as shown by 314 in FIG. 3, namely comprising of 304 followed by an index, where the index comprising a counter (as detailed next).

To explain the above considerations, for non-zero occurrences, the above unique ten bit construct (0001_10100_1) can describe 256 members of class 19 (using an eight bit counter), at a gain of 1. The original descriptions of these 256 members are released, and when combined with the original description of other 256 members, produces a gain of 1 as well. Therefore, 512 members of 1138 (or about 50%, for simplicity of the discussion) produce a gain of 1, where 256 members are described as shown by 314 in FIGS. 3, and 256 are each described by combining two original descriptions of 19 bits each, resulting in one unique description of 18 bits. When the members have alternate representation, two consecutive such alternate representations of 19 bits each where just the last bit changes, (such as in block 205 of FIG. 2, where two nine bit representations are combined to obtain an eight bit representation) are combined and an 18 bit representation is obtained. When alternate representation is used, such alternate representation is used for all classes (origin and target), for the columns that have the entries, similar to Scheme 1. When no alternate representation is used, the only difference (and challenge) is to combine two 19 bit class members to obtain a unique equivalent 18 bit representation. This is a challenge since the two 19 bit members usually have no correlation. A direct solution to this challenge is that the 1138 members of the class are by convention partitioned in consecutive pairs, with the first member in each pair being represented as described by 314 in FIG. 3, and the second member being described by the second member original representation with the last bit dropped. To avoid conflicts when dropping this last bit (such as when combining a 15 bit RI with a four bit RI, when the four bit RI may be in one case 0000 and in another case 0001 and by dropping the last bit in the four bit RI we get 000 in both cases), such cases will be by default part of a said "by convention" partition of pairs.

In conclusion, for the non-zero occurrences case, about 50% of class 19 target members provide a gain of 1, while the other about 50% of members provide zero gain. There are therefore two divisions of class 19 members in this case, and one bit is added as cost to choose which of these two divisions is used.

For the zero occurrences case, the discussion is very similar. The only difference is that the above unique nine bit construct (0001_10100) can describe 512 members of class 19 (using a nine bit counter), at a gain of 1, i.e. about 50% of class 19 members. The other 50% of class 19 members will provide a gain of 1 by combining the two original descriptions, using a similar procedure as exemplified above in the two possible implementations. Similarly, alternate representations or not, can be used. In this case, there are no divisions (the entire class provides gain, since all members are covered).

Since a class 19 member has a $2^{10}$ lower probability of occurrence than a class 9 member, when accounting for all class 19 members (1138 or about $2^{10}$ for simplicity of this discussion), it is apparent that in an IFDS slice of size n*16,000 PS where each class 9 member has nominally n occurrences, there are approximately n total class 19 members occurring for that respective pair (column) to which E1 belongs to. Since the non-zero (zero) occurrence case covers 50% (100%) of class 19 members at a gain of 1, it translates into having about n/2 (n) nominal members that will produce a gain of 1.

Example a. For a non-zero occurrences entry and an IFDS slice of 256*16,000PS, and a class 9 E1 on column k at member M1 having N1 occurrences, where member M1 targets class 19 as the target class, the compression condition, in nominal terms, is N1<128-cost, where cost is 9 bit (to specify matrix column) plus 7 bit (to specify matrix row) plus 1 bit to specify one division of 512 members (out of the 2 that are possible). This translates that Scheme 2, as is now, will produce gain if there is an entry in the 496 by 100 matrix (49,600 possibilities) that has the number of occurrences N1 smaller than 111, when the nominal is 256.

b. For a similar scenario but a zero occurrence entry, the compression condition becomes "cost<256", with cost=16 (9 for the column, 7 for the M1), condition which obviously is always true. But obviously having a zero occurrence entry for a slice of 256 average occurrences has a low probability. The zero occurrence entry scenario works on a much smaller IFDS slice, such as a 16*16,000 PS slice, where the probability to have a zero occurrence entry anywhere in the 49,600 matrix is good. The additional condition is that for the column where the zero occurrence entry resides, the target class must have more than 16 occurrences (when the average is 16), conditions which again has a good probability.

The probability of Example (a) above is a function of the IFDS content distribution, being conditioned essentially to have one entry out of 49,600 possibilities with a minimum of 110 occurrences from a nominal of 256. This probability can be further improved, based on the following considerations:

i. The gain produced by the target class is at nominal value. But the content of the target class in itself is subject to a distribution, i.e. the 256 nominal content of class 19 varies.

ii. In the "cost", one bit is specified that will select one of the two divisions of 512 class 19 members. The content of these two divisions in an arbitrary IFDS is subject to a distribution, and the chosen division is the one that has the largest content, therefore the largest than the nominal value of 128.

iii. The one bit part of the "cost" can be extended. For example, 16 divisions of 64 members each can be created, out of which eight divisions are chosen as active. The idea is that nominally, each of the 16 divisions will have 16 members that produce gain, but since the 16 divisions are automatically subject to a distribution, the eight divisions with the highest content will be chosen. The "cost" increases from one bit to C16_b 8 (combinations of 16 taken 8), which requires about 14 bits, but if the eight chosen divisions will have a content of average 19 (instead of the nominal 16), which has a good probability, then the gain becomes 8*19 (from the eight divisions) minus 14 (the cost to choose the eight divisions)=138 (that is instead of 8*16−1=127, which would be for the nominal values), therefore a net gain of 11 out of this technique.

iv. Use a different class as a target class. Any class can be a target class. Class 15 is exemplified next. Class 15 has 872 members, and each member has a 16× larger probability of occurrence than a class 19 member. A non-zero occurrence case will have 32 members of class 15 at gain of 1, meaning that there are 28 divisions to cover all 872 members. Out of these 28 divisions, one is chosen as active. In the same 256*16,000 PS slice, there will be 16*256 members that occur in each pair (matrix column). Out of these, ½8 will produce gain, i.e. about 144. Five bits will be the cost to specify one of the 28 divisions, resulting in a nominal net gain of 139. This nominal gain can be improved with any of (i.), (ii.), (iii.) above, or extensions and variations of these. Note that a different target class may produce different results (139 nominal for class 15 versus 127 nominal for class 19).

Improvements i-to-iv above can be used for the zero-occurrence entry scenario, with adjustments that are obvious for the person skilled in the art.

BDCD_s3: BDCD Scheme 3

Scheme 3 is an extension scheme that applies both to Scheme 1 and Scheme 2 and deals with large groups of same type bits (either all 0 or all 1), specifically creating compression gain for such groups. If Scheme 3 is not applied (maybe the distribution in the IFDS slice does not contain such groups of same type bits, or for any other reason), the compression with Scheme 1 or Scheme 2 remains as is. Scheme 3 enhances the compression and is applied at the same time as Scheme1 or Scheme2 is applied.

BDCD_s3 works the same for Scheme 1 and Scheme 2, but differs as a function if the implementation is using the alternate representation for RI pairs, or not, as disclosed above. BDCD_s3 is useful in providing compression for large groups of same type bits, with the magnitude of such compression being essentially linear with the number of bits in such groups of same type bits. As disclosed below, BDCD_s3 can be optimized to compress groups of same type bits where this group is of relatively low number of bits (such as for example 15 or even lower), but the restrictions increase as this number of bits in such groups gets smaller. Therefore, it is preferable to employ BDCD_s3 for larger such groups of bits, such as larger than 25 or 30.

As an overview, when BDCD_s3 is employed, a group of same type bits that is desired to produce compression must be included in one of the column of the entries of the respective scheme (Scheme 1 or Scheme 2), otherwise that group is not processed (is left as is). The compression gain produced by that group of same type bits that is included in an entry column of Scheme 1 or Scheme 2 will increase the compression gain of the respective scheme. All these aspects are detailed next. There is a tremendous amount of variations and optimizations for BDCD_s3 applicable for both Scheme 1 and Scheme 2—these variations and optimizations do not change the fundamentals of the disclosure, are apparent to a person skilled in the art, and are not possible to be outlined entirely in this disclosure due to the amount of details which are not relevant for the substance of the disclosure, details that can be easily inferred by a person skilled in the art. BDCD_s3 is disclosed for Scheme 1 when implemented with alternate representation, and for Scheme 2 when implemented without alternate representation for RI pairs, using examples to cover the fundaments. BDCD_s3 works the same for Scheme 1 and Scheme 2 when implemented the other way around, and therefore the disclosure is covering such obvious variations fully.

BDCD_s3 for Scheme 1 Implemented with Alternate Representation for RI Pairs

To exemplify, the IFDS slice size that is considered for the exposition in this disclosure is 256*16,000 PS. The exposition will also exemplify other specific options, such as when class 9 RI pair is chosen as the contained class for Scheme 1. In a real implementation, all these options can be varied dynamically and freezed when compression gain is obtained.

As mentioned, BDCD_s3 will be disclosed for Scheme 1 when this is implemented using alternate representation of RI pairs. Since, theoretically, groups of same type bits up to the size of the IFDS can occur, this alternate representation can be demanding practically. BDCD_s3 will also address this demanding representation by limiting this representation to an upper limit, as disclosed next. Across disclosing BDCD_s3 for Scheme 1 in the above mentions conditions, reference will be made to FIG. 4.

A requirement for BDCD_s3 is that the group of same type bits that is eligible to be compressed must belong to a pair belonging to one of the columns carrying the said entries. Such a group is represented by an RI. Since every entry is an RI pair that belongs to one of the 496 columns, the RI for said same type bit group is paired with another RI, where this another RI can be any RI from class 4 to the theoretical infinity. There are several restrictions related to this another RI. These are outlined below for a nominal, theoretical stance. It is noted that multiple variations and optimizations are possible.

i. This another RI must not be an RI of a same type bit group that is also considered for compression ii. It must not be part of part of a specific RI pair class iii. The lower limit of number of bits in the same type bit group (i.e. the RI class of this group) is chosen such that the pair (matrix column) created between the RI representing the group of same type bits and the another RI in the considered pairing range will not contain any pairs belonging to the part of a specific RI pair class mentioned at (ii) above.

Figure 4:
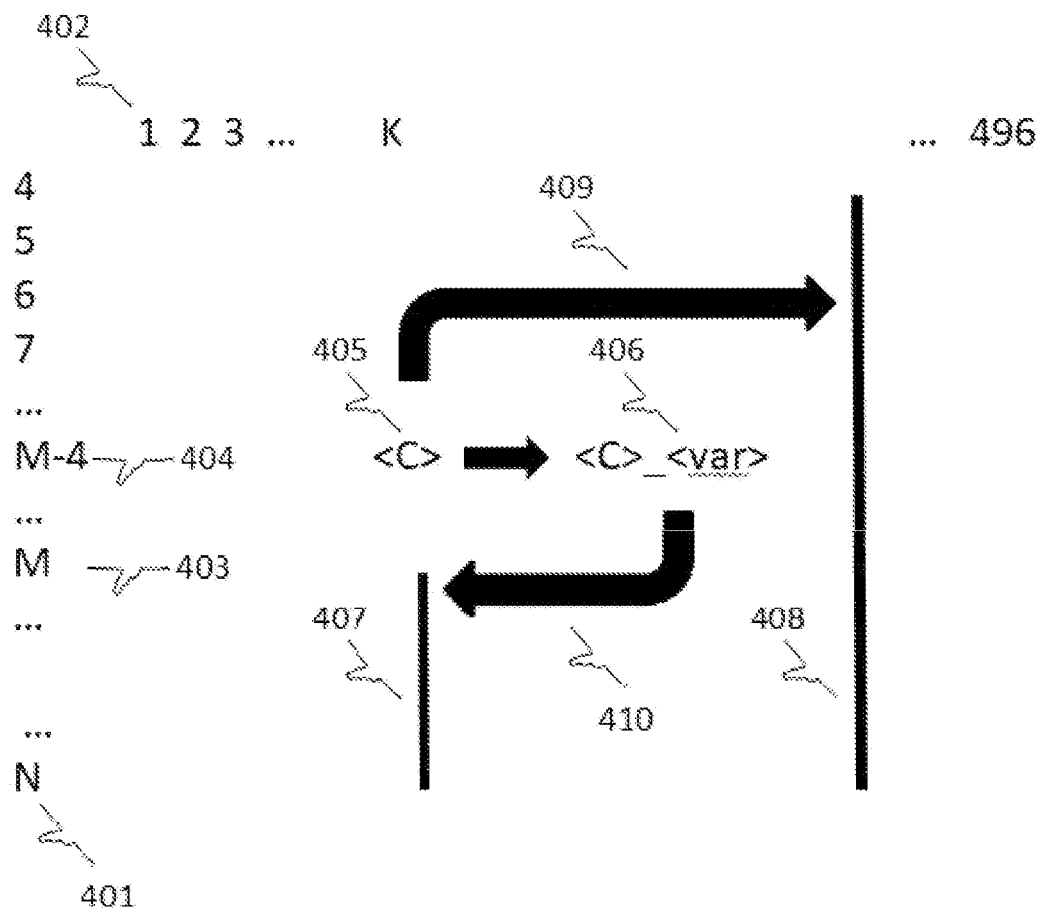
FIG. 4 is used to summarise the key embodiments and steps of the disclosed Scheme 3.

The example provided below exemplifies the restrictions outlined above, based on mathematical derivations from data outlined in this disclosure and UPA, and progressively discloses the embodiments specific to Scheme 3. These mentioned derivations are not literally presented here, since they are apparent to a person skilled in the art and the data presented is sufficient to describe the fundaments of the disclosure. The discussions are referred to FIG. 4. In FIG. 4, a matrix is shown, where 402 are the 496 columns representing the C32_2 pairs that can be formed in a pairing range. 401 in FIG. 4 signifies the lead RI of a pair, where the lead RI is the RI from the largest class in that pair. For example, if a pair is formed between a class 15 RI and a class 4 RI on column K, it is entered in the FIG. 4 matrix in the row labelled 15. The lowest lead RI can be 4 (the lowest RI), as shown in FIG. 4, where the first row is 4.

a. For a 256*16,000 slice size, the lower limit for a group of same type bits that meets the above restrictions for the worst case distribution is 20 (represented by member M shown as 403 in FIG. 4). In this case, M=20 is shown as the lead RI in a pair. This worst case distribution (described below) has a very low probability, but it is described below because this distribution has a very important theoretical significance for this part of the disclosure. While for realistic distributions (the bulk of distributions) a notably lower than 20 same type bit group is possible, choosing a lower same type bit groups, may, for certain distributions, disable any possible choice of entries in Scheme 1, or introduce significant restrictions (as shown below) leading to no possible compression for that respective IFDS slice. On the other hand, choosing a lower same type bit group may produce a stronger compression for specific distributions within the respective IFDS slice, so, a trade-off is obvious in-between having a stronger compression or having no compression for slices with specific unfavourable distribution. Such trade-off criteria are straight-forward definable to a person skilled in the art, and are not discussed in this disclosure. Groups of same type bits of 20 and higher will be exemplified next, just to show the critical, low probability situation, which is relevant for the disclosure.

b. In order to implement this compression gain for groups 20 and higher, one class 16 RI pair alternative representation is reserved (four units below the RI of 20, where this number four will become apparent why chosen as such, below). By reserving this one class 16 representation (shown in FIG. 4 as 404), derivations show that class 26 and above RI pairs will remain without representation. Class 26 and above RI pair class is the specific RI pair class mentioned at (ii) in the restrictions above, for this example case, as not being "part of a part of RI classes". The "part of a part" formulation is clarified next. Below is disclosed how to deal with these classes.

c. Class 26 can be formed as pairs of RIs such as 22-4 (4-22), 21-5 (5-21), 20-6 (6-20), 19-7 (7-19), 18-8 (8-18), 17-9 (9-17), 16-10 (10-16), 15-11 (11-15), 14-12 (12-14), and 13-13, where the RI members of each class (see FIG. 1) are used for these pairs. The pairs 22-4, 21-5, and 20-6, with their duals, do not exist (22-4), or have a lead member (21, 20) less, because groups of same type bits greater or equal than are treated differently. Starting with lead RI 19 and below, all members contribute. Similarly can be discussed for each of classes 27 and above.

d. In an arbitrary input string, any content (any pair) occurs, and therefore all pairs must have representation. Since, by reserving one class 16 RI pair alternative representation, class 26 and above RI pairs remain without representation, a solution for these classes to get representation must be developed. Providing such solution to get representation for these classes is a key embodiment of this disclosure for Scheme 3.

e. As mentioned, for a large group of same type bits to be compressed, this must be on the same column as the said entries. One said solution to provide representation for class 26 and above is, to not allow, in that column, one or more RI classes. For the considered example (20 and above same type bit groups considered for compression in a 256*16,000 IFDS slice), not allowing (or forbidding) RI class 19 on said column is sufficient to provide representation for everything else. Forbidding class 19 RI means that pairs 19-7 (7-19), 19-8 (8-19), 19-9 (9-19) . . . 19-19, and 19-20 (20-19), 19-21 (21-19), these two without the and 21 same type bit group RI, cannot occur on that column. Clearly, pairs (22 and greater)-19 cannot exist since (22 and greater) RIs are only RIs of same type bits.

f. In a slice of 256*16,000, nominally, 24 occurrences of a class 19 RI can occur. If each of these 24 occurrences, in the 256*256 pairing ranges of 32 that exist in the slice, occupy a distinctive position of the 32, means that 24 positions out of 32 cannot form a pair in the original 496 by 100 matrix, which means that the original 496*100 matrix is restricted to 28 by 100, where the 28 columns represent C8_2 (instead of the original C32_2). That means that both the entries for Scheme 1 and the 20 and greater same type bit group to be compressed must be on one of these 28 columns of the restricted matrix. Even a so called lock condition can be formed, when there are 32 (instead of 24) occurrences of class 19 RIs in the 256*16,000 slice, and all these 32 occurrences occupy one distinctive position of the 32 positions of the pairing range across the 256*256 pairing ranges in the slice. Note that such distributions, as exemplified above, have low probability, since such distributions have been named to distinctively occupy one position per occurrence in the pairing range. However, even with less restrictive distributions, the consequence of having a restrictive matrix for the entries is not desired.

g. There are two solutions to not having such a restrictive matrix for the entries; one is to have a smaller IFDS slice, and the other one is to have a larger minimum same type bit group. For example, if the slice is 64*16,000 (instead of 256*16,000), the worst case number of forbidden positions in the pairing range become 6 (instead of 24), and the number of available columns in the 496 by 100 matrix becomes 325 (C26_2) by 100 instead of 28 by 100. If the same type bit group is 25 and larger (instead of 20 and larger), then a 21 bit alternate representation is reserved (instead of the 16 one), 24 and 23 classes of RI are forbidden from the columns with entries and 25 and larger same type bit groups to be compressed, which for a 256*16,000 slice generates no restrictions up to one position in the 32 pairing ranges corresponding to no restriction up to 31 restricted columns in the 496 by 100 matrix (i.e. 465 columns are unrestricted). Doing even higher that 25 and larger groups reduces the probability of having these 31 restricted columns further.

h. The real value of Scheme 3 is to provide means to efficiently compress groups of large number of bits (such as greater than 30), and to simplify and limit the possible pairs of RIs (which without Scheme 3 would extend to a theoretical infinity), so, considering compressing groups of same type bits smaller than 30 is of little value unless for a small number of unique distributions within the considered IFDS slice. The theoretical perspective described above covers full disclosure of the situations in such cases.

i. In FIG. 4, any forbidden columns in the 496 by 100 matrix, as described above, are symbolically shown as line 408.

j. Given that all 20 and larger same type bit RI are part of compression according to BDCD_s3 but up to class 21 RI pairs there are other RI than the same type bit RI, the last pair that can exist when BDCD_s3 is applied is pair class 42 (resulting from pairing two class 21 RIs). If the RI for the minimum same type bit group considered for compression would be greater than 21 (such as 25), then the last pair that can exist would be double that RI (such as 50).

k. Considering, as described above, that a number of columns in the matrix of FIG. 4 are forbidden and that the non-forbidden column K as shown in FIG. 4 is the chosen column for the entries of Scheme 1, then on this column, the 16 bit reserved representation is represented by code <C> indicated by 405 in FIG. 4. Using this code <C>, all the pairs containing a group (RI) of 20 same type bit and larger are formatted as 406 in FIG. 4. The said such formatted pairs are symbolically shown as line 407 in FIG. 4 with arrow 410 showing that the 406 formatting describes such formatted pairs. Arrow 408 in FIG. 4 symbolizes that the code <C> and the forbidden columns are related, code <C> conditioning these columns. The formatting details are:

<16 bit reserved representation><1 bit><variable bit> is represented by 406 in FIG. 4
  <16 bit reserved representation>—as detailed at (b) above, is the code <C> in FIG. 4
  <1 bit_1><1 bit_2><variable bit> is <var> part of 406 in FIG. 4, where:
  <1 bit>—a value of 0 (1) indicates that the same type bit group is the first (second) position in the considered pair, such as position 5 (position 27) in the 5-27 pair (column).
  <variable bit> is used to describe what is the group of same type bit, such as:
    00->20 bits of same type—gain 1
    01->21 bits of same type—gain 2
    10->22 bits of same type—gain 3
    11_00->23 bits of same type—gain 2
    11_01->24 bits of same type—gain 3
    11_10->25 bits of same type—gain 4
    11_11_000->26 bits of same type—gain 2
    . . .
    11_11_110->32 bits of same type—gain 8
    11_11_111<7 bits>->33-to-160 bits of same type—gain 2-to-128
    11_11_111<seven 1s>_<128 bits>->161-to-$2^{127}$ bits of same type—gain 2-to-$2^{128}$ i. The RI for the group that creates a pair with the RI for the groups of same type bits formatted as disclosed at (k) above will be written in raw form in the output immediately after the format detailed at (k) above.

As mentioned, a tremendous amount of variations of the disclosed embodiments are possible, obvious to a person skilled in the art.

BDCD_s3 for Scheme 2 Implemented without Alternate Representation of RI Pairs

The implementation without alternate representation of RI pairs features entirely the same concepts as the implementation with alternate representation, disclosed above, the differences being only in some implementation details. BDCD_s3 for Scheme 2 is disclosed for the implementation without alternate representation of RI pairs (called for the rest of the disclosure, for simplicity S3S2) in order to outline said differences and fully disclose the implementation in both cases. There is no restriction to implement BDCD_s3 for Scheme 2 with the alternate representation of RI pairs, in this case the implementation procedure described above for Scheme 1 being applied. Similarly as above, for the BDCD_s3 for Scheme 1 implemented with alternate representation for RI pairs (called for the rest of the disclosure as S3S1 for simplicity), there is a tremendous amount of variations and optimizations that are possible, and similarly, only the fundaments are described in this disclosure, for the same reasons as mentioned above. Similarly, a worst case example will be used.

A similar derivation for a lowest same type bit group that would satisfy a lock condition will give, in similar conditions as above, a size of 22. The lock condition is, similarly, a low probability condition, and similarly as above, multiple trade-offs can be made between the probability of having a distribution subject to a lock condition (that would render an IFDS slice not to compress) and a bulk (high probability) distribution subject to a lower than 22 same type bit group that will compress. These trade-offs are apparent to a person skilled in the art, and will not be detailed here.

The theoretical steps for S3S2, in a parallel with S3S1 (to insure appropriate comparison and understanding) are:
1) For a 256*16,000 slice size, the lower limit for a group of same type bits that meets similar restrictions as for S3S1 for the worst case distribution is 22. Similarly, this worst case distribution (described below) has a low probability. All other considerations are similar as described at S3S1. Differences for S3S2 for groups of same type bits of 22 and higher will be exemplified next.
2) In order to implement this compression gain for groups 22 and higher, the RI of four units below the chosen number (22−4=18) for the same type bit group (i.e. the RI for the 18 same type bit group) is reserved. Note the first major difference between an implementation with alternate representation (S3S1) and one without (S3S2). For the one with, a specific RI pair is reserved, while for the one without, a specific single RI is reserved. The consequences of this difference will become apparent below, as the disclosure continues. By reserving this class 18 RI, all groups of 18 same type bits that show up in the IFDS slice will remain without representation. How to deal with this situation is disclosed below.
3) The reserved RI of class 18 mentioned above will be paired with another RI which can be of any class, from class 4 to infinity. Coding such pair is specific, and consists in the reserved class 18 RI followed by an index representing the other. RI, where the number of bits in the index must be the same as the number of bits in the other RI, and where the index must cover all other possible RIs in such a pair such that the gain/loss after coding such pair is zero. A straightforward derivation in coding such pair in accordance to the above will show that, in the pair, the class 18 RI must be avoided to be paired with all class 4 RIs (five of them) and six out of 10 class 5 RIs. All other pairs between the reserved class 18 RI and the other RI when this other RI is indexed, as described above, for the remaining four out of 10 class 5 RI and all class 6 RI and above, can be coded in accordance to the above remarks and conditions.
4) While the above solution is implementable, forbidding the reserved class 18 RI to pair with class 4 RIs and six of the class 5 RIs is not practical, because in a pair (column) of the 496 by 100 matrix, for a practical IFDS slice size, it is practically impossible not to have a class 4 or a class 5 RI. Therefore the practical solution is, similar to S3S1, to forbid the columns with entries and same type bit groups to be compressed from having occurrences of 18 same type bit groups.
5) Given the above conclusion, in the subject IFDS slice (256*16,000), the reserved class 18 RI nominally occurs sixteen times. That is equivalent to the said number of occurrences of the said forbidden RI pair class for S3S1. Similarly, that will leave a theoretical worst condition space of 16 to work with in the pairing range, and a space of C16_2 by 100 (120 by 100) for the said entries in the said matrix. Similar trade-offs and notes as described for S3S1 exist. To give the same additional example as in S3S1, reducing the slice size to 64*16,000, will forbid 4 of the 32 positions in the pairing range and 118 columns in the 486 by 100 matrix (having 378 by 100 available for choice of entries and 22 and greater same type bit groups). Similarly, increasing by five the same type bit group (27 instead of 22, as for S3S1 was 25 instead of 20), leads to a 50% probability (for the 256*16,000 slice) to have the theoretical one out of 32 positions to be forbidden and therefore 31 columns forbidden in the 496 by 100 matrix.
6) The coding format for groups larger or equal than 22 bits of same type, follows the same format and rules as for S3S1. All considerations and notes mentioned above hold as well.
   a. <18 bit reserved RI><1 bit><variable bit>
      i. <18 bit reserved RI>—as detailed at (2) above
      ii. <1 bit>—a value of 0 (1) will indicate that the same type bit group is the first (second) position in the considered pair, such as position 5 (position 27) in the 5-27 pair.
      iii. <variable bit> is used to describe what is the group of same type bit, such as:
         1. 00->22 bits of same type—gain 1
         2. 01->23 bits of same type— gain 2
         3. 10->24 bits of same type—gain 3
         4. 11_00->25 bits of same type—gain 2
         5. 11_01->26 bits of same type—gain 3
         6. 11_10->27 bits of same, type—gain 4
         7. 11_11_000->28 bits of same type—gain 2
         8. . . .
         9. 11_11_110->34 bits of same type—gain 8
         10. 11_11_111<7 bits>->35-to-162 bits of same type—gain 2-to-128
         11. 11_11_111<seven 1s>_<128 bits>->163-to-$2^{128}$ bits of same type—gain 2-to-$2^{128}$
7) Similarly, the RI in the pair with this group of same type bits is written in the output, in raw format, after the format of the group, described at (6) above.

Similarly to S3S1, a tremendous amount of variations of the disclosed embodiments are possible, obvious to a person skilled in the art. In conclusion when implementing BDCD_s3 without alternate representations, the key differences from the implementation with alternate representations, are:

A specific single RI is reserved, versus a specific alternate representation of an RI pair.

The forbidden columns in the entries matrix are based on forbidding all pairs that contain that specific reserved single RI only, versus forbidding all pairs of one or more well defined RI classes.

BDCD_s4: BDCD Scheme 4

Scheme 4 is another extension scheme that applies both to Scheme 1 and Scheme 2 and deals with specific optimizations to extend the scope of Scheme 1 and Scheme 2.

BDCD_s4 for Scheme 1

An important limitation of Scheme 1 is that the three entries must be on the same matrix column (belonging to the same one of the 496 pairs in the considered example). Scheme 4 eliminates this limitation, such that for example entry 1 will represent pair 34 member 3, entry 2 will represent pair 201 member 47, and entry 3 will represent pair 446 member 97. In comparison, discussing the same example, Scheme 1 would have required that the three members of the three entries, member 3, 47, and 97, belong all to pair 201 for example. The notable difference between Scheme1 and Scheme 4 becomes apparent, respectively for Scheme 1 three out of 100 entries with 496 versions can meet the compression condition, while for Scheme 4 three out of 49,600 entries (single version) can meet the compression condition. Clearly, the probability to meet three out of 49,600 is larger than to meet three out of 100 with 496 versions. The great advantage of BDCD_s4 is that two absolute minimums in the 49,600 entries matrix and one absolute maximum in the 49,600 matrix are enabled to be used. The discussion above is exemplified for class 9 RI pair. For larger RI pair classes, such as class 10, or class 11, the difference between Scheme 1 and Scheme 4 increases as the RI pair class order increases, in Scheme 4 favour. Scheme 1 implemented with alternate representation of pairs is used below, for continuity of the disclosure exposition. As mentioned, Scheme 1 can be used without alternate representation, and Scheme 4 has no restrictions from that point of view. In fact, BDCD_s4 for Scheme 2 will be disclosed for the without representation implementation.

Figure 5:
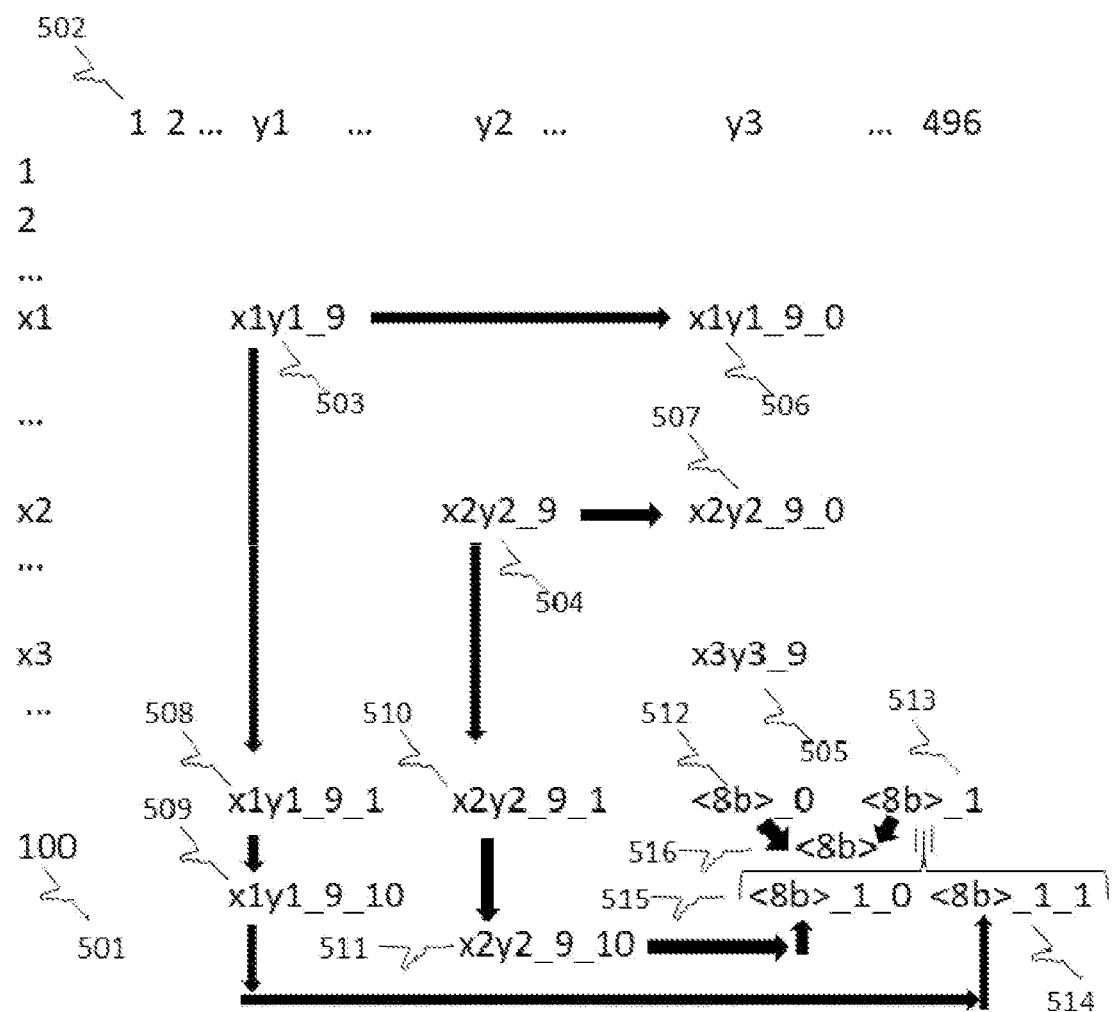
FIG. 5 is used to summarise the key embodiments and steps of the disclosed Scheme 4.

To implement Scheme 4, the following example is discussed. FIG. 5 is used as a visual aid to better understand the disclosed embodiments. In FIG. 5, the 496 (columns 502) by 100 (rows 501) matrix is shown. In the description, the following convention is used: member x of pair y for RI pair class z will be called x-y-z. Therefore, entry 1 (x1-y1-9) and entry 2 (x2-y2-9) are the two entries with minimum occurrences, and entry 3 (x3-y3-9) is the entry with maximum occurrences. If x1y1_9 (503 in FIG. 5) is the alternate representation of entry 1, x1y1_9_0 (506 in FIG. 5, where a zero is added to the 9 bit representation) will be used to represent entry 1 occurrences at a loss of 1 bit per occurrence. x1y1_9_1 (508 in FIG. 5) will be used to represent the same order class 10 RI pair alternate representation, be that called x1y1_9_10 (509 in FIG. 5), releasing it. There is no gain or loss by this x1y1_9_1 to x1y1_9_10 swap. Representing a class 9 originated representation (x1y1_9_1) with a class 10 representation (x1y1_9_10) is possible and insures a unique correspondence because class 10 has more members than class 9 (220 vs. 100). Similarly for entry 2, x2y2_90 (507 in FIG. 5) will represent entry 2 occurrences at a loss of 1 bit per occurrence, and x2y2_9_1 (510 in FIG. 5) will swap x2y2_9_10 (511 in FIG. 5) at no gain or loss, releasing x2y2_9_10. For entry 3 (x3y3), the following applies. x3y3, just like x1y1 and x2y2, is represented by 9 bits, with the format <8 bits>_0 or <8 bits>_1, where <8 bits> is a given, fixed 8 bit configuration. Say in this example that x3y3 is represented by <8 bits>_0, or <8b>_0 (512 in FIG. 5). In order to provide a gain of 1 for every occurrence of x3y3, the goal is to represent x3y3 by the <8b> configuration only. Since x3y3 is represented by <8b>_0, that means that <8b>_1 must be released, so that <8b>_0 combined with <8b>_1 creates <8b>. The <8b>_1 (513 in FIG. 5) is the neighbour pair (column), on the same member to <8b>_0 with the alternate representation having only the last bit different. In order to release <8b>_1, the available 10 bit representations x1y1_9_10 and x2y2_9_10 will be combined to generate a unique 9 bit representation that will represent all the occurrences of the original <8b>_1, releasing <8b>_1 (this block is shown in FIG. 5 by <8b>_1_0 (515 in FIG. 5) being swapped by the available x2y2_9_10 and <8b>_1_1 (514 in FIG. 5) being swapped by the available <x1y1>_9_10, releasing both <8b>_1_0 and <8b>_1_1, therefore by combining now both the available <8b>_1_0 and <8b>1_1 creates the unique 9 bit representation to represent the original <8b>_1 occurrences making the original <8b>_1 to be available). Combining <8b>_0 with the available <8b>_1, makes <8b>_0 to be uniquely represented by <8b> (516 in FIG. 5), the target 8 bit representation. Accordingly entry 1, entry 2, and entry 3 are decoupled to be anywhere in the 49,600 entries matrix, while still keeping the same compression condition N3>N1+N2+cost. The cost however increases, and now consists in specifying the column and member for each of the three entries, i.e. 3*(9+7)=48 bits. Because of this cost, BDCD_s4 will start working for IFDS slices starting with 32*16,000, but 16*16,000 can be possible if an entry in the 49,600 matrix has more than (48 plus x1-y1_9 plus x2-y2_9 occurrences) occurrences.

A particular case is when there is an entry of zero occurrences in the matrix. In this case, only the zero occurrence entry and the maximum occurrence entry are needed. The cost is 2*(9+7)=32 bits. In this case, the scheme will work fairly common for a minimum IFDS slice of 16*16,000, but a slice of 8*16,000 can work if an entry in the 49,600 matrix has more that 32 occurrences.

BDCD_s4 for Scheme 2

For Scheme 2, the limiting characteristic is that the entry in the origin class and the target class must be on the same matrix column. Similarly as for BDCD_s4 for Scheme 1, this limitation is eliminated, i.e. the entry for the origin class can be on one column and the target class can be on another column, with the benefits similar as described for BDCD_s4 for Scheme 1.

To use a similar example as discussed when Scheme 1 was disclosed above, same 0001_10100 member (discussed at Scheme 2 disclosure) is discussed in the zero and non-zero occurrence scenarios.

In the zero occurrences scenario, the 0001_10100 9 bit member configuration on column (pair) 4 becomes available for use towards a target class such as class 19. But the class 19 target class has maximum occurrences on column (pair) 201. In order to make the 0001_10100 (called M1) available configuration to work on column 201, the following procedure applies. The M1 occurrences on column 201 will be moved in the same position as on column 201 on column 4, being represented by the available configuration 0001_10100. The implementing hardware or software will see members M1 on column 4 and will know that these are occurrences from column 201, and in fact on the respective position, in column 4, are the next configurations represented in the string. This way, the M1 configuration becomes available on column 201, and is used for the target class, as described at BDCD_s2.

In the non-zero occurrence scenario, 0001_10100_0 (10 bit) configuration will be used to describe the M1 occurrences on column 4 at a loss of 1 bit per occurrence. The 0001_10100_1 becomes available and it will be used to describe the same order class 10 occurrences on column 4 (be the representation for these called M1_10 for the simplicity of this discussion). The original M1_10 representation on column 4 becomes available to be used towards the occurrences of a target class, such as class 19 target class. However, similarly as discussed above, class 19 target class has the maximum occurrences on a different column (pair) such as column 201. Similarly as above, the M1_10 occurrences on column 201 will be moved in the same position as on column 201 on column 4. The implementing hardware or software will see members M1_10 on column 4 and will know that these are occurrences from column 201, and in fact on the respective position, in column 4, are the next configurations in the string. This way, the M1_10 configuration becomes available on column 201, and is used for the target class, as described at BDCD_s2.

When a known target class is always used, the cost for BDCD_s4 for Scheme 2 is, for zero occurrences, (column plus row specification for origin class) plus (column for target class). For class 9 that is 25 bits. If the target class is customizable, a few extra bits (say three bits for the choice option of eight target classes) plus possibly maximum three bits to choose a segment in a target class (as disclosed above) can be added. Therefore, the cost can be in-between 25 and 31 bits. That makes a 16*16,000 slice size a good probability and performance choice.

For non-zero occurrences, the cost increases with 1 bit for every occurrence of the consider entry in the origin class.

Similar considerations/improvements as disclosed at BDCD_s4 for Scheme 1 are applied here for both zero and non-zero occurrences. And similarly, multiple variations, optimizations, and scenarios can be developed and are obvious for a person skilled in the art, and these do not represent a limitation of this disclosure.

Four schemes and multiple options to create compression gain have been disclosed. In an implementation, the scheme/option scenario that provides the largest gain is chosen. The choice of scheme/option scenario is not necessarily a sole function on the gain value, but, dependent on the application as well. For example, applications such as audio telephony requires low latency in the audio stream which, applied to the present disclosure, would have the consequence of requiring small IFDS slices. One option to reduce the IFDS slice size for such applications, for this disclosure, is to employ default pairing schemes where cost to specify the said entries is eliminated, the cost in these default pairing cases being only a header to specify one of the possible default pairing schemes. As disclosed, BDCD_s2 is more suitable for small IFDS slices, but BDCD_s1 is appropriate for such a goal as well, when implementing entries with zero occurrences.

Figure 6:
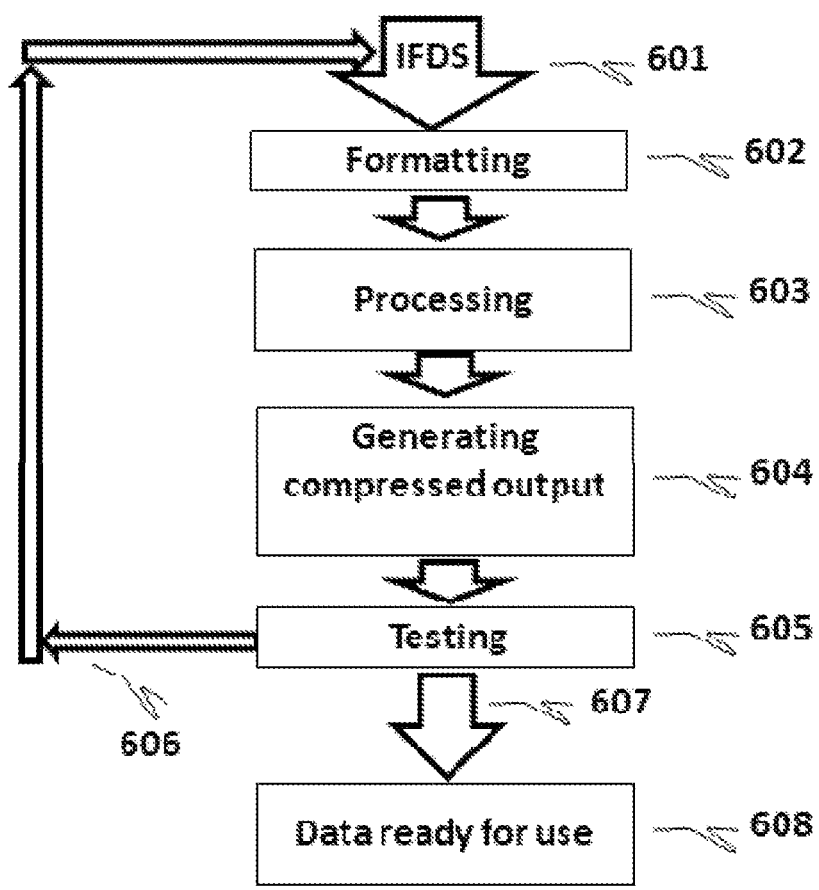
FIG. 6 is used to summarise the data flow from the initial data input to the final compressed data output, in accordance to one or more of the disclosed embodiments.

To conclude the disclosure, the data flow according to the disclosed embodiments is summarised in FIG. 6. The arbitrary input data string, IFDS, (601 in FIG. 6) is formatted (the 602 step in FIG. 6), where this formatting step comprising fully describing said IFDS using a set of well defined binary constructs. The formatted data string is processed (step 603 in FIG. 6), where this processing step comprising one or a combination of the disclosed schemes 1-to-4, specifically creating the set of well defined binary elements, the pairing ranges, partitioning the said IFDS in slices, characterizing the content of the said IFDS slices in term of occurring binary structures such as binary constructs and binary elements, creating the applicable matrixes, identifying the applicable sets of binary constructs, elements, and target classes. Based on the processed IFDS, an output is generated at step 604 in FIG. 6, where the generated output features compressed data, therefore a number of bits smaller than the input IFDS. The generated output may have the same number of bits as the input in cases when the processed and formatted IFDS does not meet any compression conditions for neither of Schemes 1-to-4 and none of their options. The generated output is subject to the testing step 605 in FIG. 6, where generally the testing step is testing if the number of bits in the generated output is smaller than a compression target or is smaller than a floor size below which compression may not have the desired efficiency. If the testing is not met, path 606 in FIG. 6 is followed, and the generated output is fed back at the input 601 for a new compression cycle. Any number of such cycles are possible. If the testing is met, path 607 in FIG. 6 is followed and the compressed data is ready for use (608 in FIG. 6).

From reading the present disclosure, other variations and modifications will be apparent to the skilled person. Such variations and modifications may involve equivalent and other features which are already known in the art or are implied by the embodiments presented in this disclosure. Such variations and modifications may increase the performance of the BDCD method, such as may increase the compression/decompression efficiency or speed.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A method comprising:
   developing a set of well defined binary constructs comprising a finite number of subsets of said binary constructs wherein each of said subsets has a finite number of members of a same number of bits, and wherein the members of every subset has a different number of bits;
   describing any arbitrary binary input string using said set of well defined binary constructs;
   creating a well defined set of binary elements wherein said binary elements comprise of all possible groupings of well defined number of members of said set of binary constructs, wherein said number of members is two or more, and wherein said set of binary elements comprising a finite number of subsets of said binary elements wherein each of said subsets has a finite number of members of a same number of hits, and wherein the members of every subset has a different number of bits;

processing said binary string in order to create variability and distributions in term of binary constructs and binary elements that occur within said string or a well defined segment of said string and wherein said variability and distribution is assessed with respect to a nominal base that is defined based on well defined mathematical and statistical criteria; and wherein said processing is generating data compression.

2. The method of claim 1 wherein said processing comprising:

partitioning said described binary input string into successive groups of said binary constructs wherein each of said successive groups have same well defined number of positions wherein each position is taken by one of said binary constructs;

tabulating all said binary elements belonging to one of said subsets of binary elements, when said binary elements result from exhaustive combinations of binary constructs from all said positions belonging to each of said successive groups, wherein said exhaustive complies mathematical relationships such as combinations of k taken m, wherein k represents the said number of said positions in a said successive group and m represents the said number of members used in the groupings of said binary elements, wherein said tabulating generates a first matrix of size x by y wherein x are the matrix columns and y are the matrix rows, with x being the number of said exhaustive combinations and y being the number of distinctive said binary elements of said subset for which said tabulation is performed;

summing all said tabulated binary elements for multiple successive groups, wherein said summing occurs for each position in said first matrix, wherein said multiple represents a number that is decided based on well defined criteria, and wherein said summing generates a specific number of occurrences for each of said position in the said first matrix;

identifying one or more of said tabulated and summed binary elements of specific characteristics in said first matrix wherein said identifying is performed to meet a well defined criteria wherein said criteria is defined as standalone for a said identified binary element or is defined as a relationship between two up to all of said binary elements in said first matrix; and wherein said identified elements are used to generate data compression.

3. The method of claim 2 further comprising:

said identified binary elements of said first matrix as well as all said binary elements of same said exhaustive combination represented by a column x in said first matrix as said identified binary elements in all said successive groups, no matter to which of said subset of binary elements they belong to, may or may not be transformed into a unique equivalent format, wherein said equivalent means that the number of bits of every said binary element is preserved, wherein said may means that are all transformed and said may not means none is transformed; and generating an output based on a well defined mathematical or statistical relationship between specifics of said considered elements, wherein said specifics is a characteristic of said considered elements such as said specific number of occurrences, and wherein said generating requires well defined processing of said transformed identified binary elements.

4. The method of claim 3 wherein said generated output has a number of bits that is smaller than the number of bits in said input string that corresponds to said multiple successive groups for which said output is generated.

5. The method of claim 2 further comprising:

developing a second matrix of size x by z, wherein x are the matrix columns and z are the matrix rows, wherein x is the same as in said first matrix and z is a number that is equal to the number of all said subsets of binary elements that have the number of bits larger than the number of bits of the subset of binary elements considered in said first matrix, wherein for each of said subset from said number of subsets, all binary elements of that subset that occurs within each said successive group are summed for each of said exhaustive combination represented by an x column value and entered in that corresponding position of said second matrix;

summing all said binary elements of each of said corresponding positions of said second matrix for multiple successive groups wherein said multiple represents a number that is decided based on well defined criteria, and wherein said summing generates a specific number of occurrences for each of said corresponding position in the said second matrix;

identifying one or more of said corresponding positions of specific characteristics in said second matrix wherein said identifying is performed to meet a well defined criteria wherein said criteria is defined as standalone for a said corresponding position or is defined as a relationship between two up to all of said corresponding positions in said second matrix;

wherein said identified binary elements of said first matrix and said binary elements of said identified corresponding positions of said second matrix as well as all said binary elements of same said exhaustive combination represented by a column x in said first matrix or said second matrix as said identified binary elements and identified binary constructs, in all said successive groups, no matter to which of said subset of binary elements they belong to, may or may not be transformed into a unique equivalent format wherein said equivalent means that the number of bits of every said binary element is preserved, wherein said may means that are all transformed and said may not means none is transformed;

wherein one or more of said identified binary elements of said first matrix and one or more of said identified corresponding positions of said second matrix comprising a well defined mathematical or statistical relationship between specifics of said elements and said positions, wherein said specifics is a characteristic of said elements and said positions such as said specific number of occurrences; and wherein an output is generated based on well defined processing of said elements and said positions.

6. The method of claim 5 wherein said generated output has a number of bits that is smaller than the number of bits in said input string that corresponds to said multiple successive groups for which said output is generated.

7. The method of claim 3 further comprising:

binary constructs representing groups with a number of bits larger than a well defined number, called special groups, are specially processed, and where the location of such special groups is identified in connection to said identified binary elements;

wherein said specially processing comprising reserving a well defined said binary element;

wherein said reserved binary element is used to specially describe said special groups;

wherein a said identified binary element is active when any one of a limited number of well defined binary elements does not occur in any one of said multiple successive groups on the same said exhaustive combination represented by an x column value in said first matrix as the said identified binary element; and wherein said specially describing said special groups generates a final output string featuring compression gain.

8. The method of claim 5, further comprising:

binary constructs representing groups of bits with a number of bits larger than a well defined number, called special groups, are specially processed and where the location of such special groups is identified in connection to said identified binary elements;

wherein said specially processing comprising reserving a well defined binary construct;

wherein said reserved binary construct is used to specially describe said special groups;

wherein a said identified binary element or a said corresponding position is active when any one of a limited number of well defined binary elements does not occur in any one of said multiple successive groups on the same said exhaustive combination represented by an x column value in the said first or second matrix as the said identified binary element or said corresponding position; and wherein said specially describing said special groups generates a final output string featuring compression gain.

9. The method of claim 3 wherein said well defined processing of said identified binary elements comprising:

a well defined number of said identified binary elements out of which a well defined number has low number of occurrences and another well defined number has high number of occurrences, wherein each corresponds to one position in said first matrix and being represented by a unique code of same number of bits;

wherein said elements of low number of occurrences are represented by adding a well defined suffix after their said code and wherein their code followed by another well defined suffix are processed to enable a unique identifiable binary structure of a number of bits smaller than the number of bits of the said element of high number of occurrences wherein said unique identifiable structure replaces to represent said element of high number of occurrences; and wherein the cost associated with representing the elements of low number of occurrences plus the cost associated to specifying the location in the said first matrix of the said well defined number of the said identified binary elements is smaller than the gain associated with representing the said elements of high occurrences by said unique identifiable binary structure.

10. The method of claim 5 wherein said well defined processing of said elements and said corresponding positions comprising:

a well defined number of said identified binary elements of said first matrix has low number of occurrences and another well defined number of said corresponding positions has high number of occurrences, wherein said elements have the same number of bits and said positions have a larger number of bits than said elements;

wherein said elements are represented by adding a suffix after their said code and wherein their code followed by another suffix are processed to enable a unique identifiable binary structure that is used to represent the said corresponding position of high number of occurrences with a number of bits that is smaller than the number of bits of said corresponding position, wherein the difference in the number of bits between said structure and said position determines how many of the elements of said position can be represented with said binary structure, wherein the ratio between the number of elements that can be represented and the total number of elements in said position gives the percentage of high occurrences that produce gain; and wherein the cost associated with representing the elements of low occurrences plus the cost associated to specifying the location in the said first matrix of the said elements and to specify the location in said second matrix of said positions is smaller than the gain given by the percentage of high occurrences that produce gain.

11. The method of claim 7 wherein said reserved binary element is used to specially describe said special groups, comprising:

said reserved element is used together with well defined headers to equivalently describe said special groups, wherein said special groups represent groups of bits of same type;

wherein the number of bits in said special groups minus the number of bits in said reserved element together with the number of bits in said headers, create a difference wherein said difference is greater than zero and in special cases equal to zero;

wherein said difference increases as the number of bits in said special groups increases;

wherein said difference represents the compression gain; and wherein to compensate for the said reserved element, specific well defined binary elements must be avoided from being used, wherein the said avoiding process is implemented by controlling and deciding which binary elements are said identified so that conflict with said avoided binary elements is eliminated, wherein said conflict means that a said identified binary element and a said to be avoided binary element are on the same said x column of said first matrix or a well defined relationship between their columns in said matrix exist.

12. The method of claim 8 wherein said reserved binary construct is used to specially describe said special groups, comprising:

said reserved binary construct is used together with well defined headers to equivalently describe said special groups, wherein said special groups represent groups of bits of same type;

wherein the number of bits in said special groups minus the number of bits in said reserved binary construct together with the number of bits in said headers, create a difference wherein said difference is greater than zero and in special cases equal to zero;

wherein said difference increases as the number of bits in said special groups increases;

wherein said difference represents compression gain; and wherein to compensate for the said reserved binary construct, specific well defined binary elements where said binary construct is part of must be avoided from being used, wherein the said avoiding process is implemented by controlling and deciding which binary elements or corresponding positions are said identified so that conflict with said avoided binary elements is eliminated, wherein said conflict means that a said identified binary element or corresponding position and a said to be avoided binary element are on the same said x column of said first matrix or of said second matrix or a well defined relationship between their columns in said matrixes exist.

13. The method of claim 7 wherein the process is repeated in a loop by feeding the said final output string back as a said input string.

14. The method of claim 8 wherein the process is repeated in a loop by feeding the said final output string back as a said input string.

15. A method wherein a finite set of binary constructs is being developed to describe any arbitrary input binary string, wherein exhaustive groupings of said constructs belonging to said finite set create a finite set of grouping elements, wherein these grouping elements generate distributions of occurrences within a well determined segment of said input string wherein said distributions are a function of the binary constructs content of said segment of said input string, wherein within said distributions grouping elements of low occurrences and of high occurrences are located, and wherein these located grouping elements are processed based on mathematical and statistical procedures to create compression gain.

16. The method of claim 15, wherein one of said grouping elements or one of said binary constructs is reserved and used to model for compression well defined content of said input string, wherein to compensate for the use of said reserved element or construct, specific well defined grouping elements must be avoided from being used, wherein the said avoiding process is implemented by controlling and deciding which grouping elements of low occurrences and of high occurrences are located within said distributions so that conflict with said avoided grouping elements is eliminated, wherein said conflict means any relationship between said well defined content of said input string or said grouping elements of low occurrences and of high occurrences and said avoided grouping elements.

17. A binary data compression/decompression method, wherein any input binary data string (IFDS) is uniquely and reversibly compressed/decompressed without any data loss, comprising:
uniquely formatting and fully describing the IFDS using a set of well defined binary constructs;
creating complex structures from custom combinations of said binary constructs that occur within the arbitrary IFDS content wherein the choice of the said custom combinations depend on the said IFDS content in term of binary constructs, therefore creating IFDS content variations and distributions from an expected nominal base, wherein said variations and distributions reflect the actual content of the arbitrary IFDS;
uniquely processing these variations and distributions in content using several schemes wherein each scheme brings a unique compression feature; and
wherein once this processing completes, i.e. the end of the arbitrary IFDS is reached, it is called that the end of one compression cycle is reached, and wherein another compression cycle can be applied to the data by repeating the cycle steps, and wherein such compression cycles are repeated until the desired compressed file is reached or until a file floor size limit is reached, floor size below which the disclosed compression has limitations.

18. The method of claim 5 wherein said summed specific number of occurrences for each of said corresponding positions in said second matrix is divided in a well defined number of intervals, wherein each interval represents a well defined number of said binary elements of one said subset characterized by a well defined number of bits, wherein said number of intervals depend on the said identified elements with which the said corresponding position that is divided is in said relationship, and wherein each of said intervals is selectable for use during the said processing to generate said output for optimized target performances.

19. The method of claim 5 wherein said well defined processing of said elements and said corresponding positions comprising:
a well defined number of said identified binary elements of said first matrix has zero number of occurrences and another well defined number of said corresponding positions has high number of occurrences, wherein said elements have the same number of bits and said positions have a larger number of bits than said elements;
wherein the representation, or code, of said elements of zero number of occurrences is used as a unique identifiable binary structure that is used to represent the said corresponding position of high number of occurrences with a number of bits that is smaller than the number of bits of said corresponding position, wherein the difference in the number of bits between said structure and said position determines how many of the elements of said position can be represented with said binary structure, wherein the ratio between the number of elements that can be represented and the total number of elements in said position gives the percentage of high occurrences that produce gain; and
wherein the cost associated with specifying the location in the said first matrix of the said elements and to specify the location in said second matrix of said positions is smaller than the gain given by the percentage of high occurrences that produce gain.

20. The method of claim 3 wherein said well defined processing of said identified binary elements comprising:
a well defined number of said identified binary elements out of which a well defined number has zero number of occurrences and another well defined number has high number of occurrences, wherein each corresponds to one position in said first matrix and being represented by a unique code of same number of bits;
wherein the representation, or code, of said elements of zero number of occurrences is used as a unique identifiable binary structure of a number of bits smaller than the number of bits of the said element of high number of occurrences wherein said unique identifiable structure replaces to represent said element of high number of occurrences; and
wherein the cost associated with specifying the location in the said first matrix of the said well defined number of the said identified binary elements is smaller than the gain associated with representing the said elements of high occurrences by said unique identifiable binary structure.

* * * * *